US009780136B2

(12) United States Patent
Kwon

(10) Patent No.: US 9,780,136 B2
(45) Date of Patent: Oct. 3, 2017

(54) COMPOSITE WAFER SEMICONDUCTOR DEVICES USING OFFSET VIA ARRANGEMENTS AND METHODS OF FABRICATING THE SAME

(71) Applicant: Samsung Electronics Co., Ltd., Suwon-si, Gyeonggi-do (KR)

(72) Inventor: Doowon Kwon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/273,029

(22) Filed: Sep. 22, 2016

(65) Prior Publication Data
US 2017/0092680 A1    Mar. 30, 2017

(30) Foreign Application Priority Data
Sep. 24, 2015   (KR) .................. 10-2015-0135840

(51) Int. Cl.
*H01L 27/146*   (2006.01)
*H04N 5/225*    (2006.01)
(Continued)

(52) U.S. Cl.
CPC .. *H01L 27/14634* (2013.01); *H01L 23/49827* (2013.01); *H01L 23/5226* (2013.01); *H01L 24/32* (2013.01); *H01L 25/0657* (2013.01); *H01L 27/1462* (2013.01); *H01L 27/14618* (2013.01); *H01L 27/14645* (2013.01); *H04N 5/2253* (2013.01); *H01L 27/1464* (2013.01); *H01L 27/1469* (2013.01);
(Continued)

(58) Field of Classification Search
CPC ........... H01L 23/49827; H01L 23/5226; H01L 23/5283; H01L 24/32; H01L 25/0657; H01L 27/14634; H01L 27/14636; H01L 2224/32105; H01L 2224/32111; H01L 2224/32146; H01L 2224/32147; H01L 2225/06544
See application file for complete search history.

(56) References Cited

U.S. PATENT DOCUMENTS 7,939,941 B2   5/2011   Chiou et al.
8,878,325 B2   11/2014  Wan et al.
(Continued)

FOREIGN PATENT DOCUMENTS

KR   1020110037481   4/2011
KR   1020110126891   11/2011

*Primary Examiner* — Stephen W Smoot
(74) *Attorney, Agent, or Firm* — Ward and Smith, P.A.

(57) ABSTRACT

A device includes a first integrated circuit substrate including a plurality of first metal layers interconnected by first vias and a second integrated circuit substrate on the first integrated circuit substrate and including second metal layers interconnected by second vias. An insulation layer is disposed between the first and second substrates and a connection region is disposed in the insulation layer and electrically connects a first one of the first metal layers to a first one of the second metal layers. The device further includes a bonding pad on the second substrate and a through via extending from the bonding pad and into the second to contact a second one of the second metal layers. The through via is positioned so as to not overlap at least one of the first vias, the second vias and the connection region. Methods of fabricating such device are also described.

18 Claims, 16 Drawing Sheets

(51) Int. Cl.
*H01L 23/522* (2006.01)
*H01L 23/00* (2006.01)
*H01L 23/498* (2006.01)
*H01L 25/065* (2006.01)

(52) U.S. Cl.
CPC .. *H01L 27/14621* (2013.01); *H01L 27/14627* (2013.01); *H01L 27/14636* (2013.01); *H01L 2224/32105* (2013.01); *H01L 2224/32146* (2013.01); *H01L 2224/48091* (2013.01); *H01L 2224/48237* (2013.01); *H01L 2224/73265* (2013.01); *H01L 2225/06544* (2013.01); *H01L 2924/15311* (2013.01)

(56) References Cited

U.S. PATENT DOCUMENTS

| | | | |
|---|---|---|---|
| 8,969,194 B2 | 3/2015 | Pyo | |
| 2007/0170574 A1* | 7/2007 | Lauxtermann | H01L 21/76898 257/686 |
| 2010/0270674 A1* | 10/2010 | Zhu | H01L 23/522 257/758 |
| 2013/0241022 A1 | 9/2013 | Oka | |
| 2015/0079718 A1* | 3/2015 | Chen | H01L 27/14634 438/59 |
| 2015/0091124 A1 | 4/2015 | Liu et al. | |
| 2015/0171132 A1 | 6/2015 | Chen et al. | |

\* cited by examiner

COMPOSITE WAFER SEMICONDUCTOR DEVICES USING OFFSET VIA ARRANGEMENTS AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2015-0135840, filed on Sep. 24, 2015, in the Korean Intellectual Property Office, the entire contents of which are hereby incorporated by reference.

BACKGROUND OF THE INVENTION

The present disclosure relates to semiconductor devices and methods of fabricating the same and, more particularly, to semiconductor devices including semiconductor chips stacked at a wafer level stage and methods of fabricating the same.

Due to their small-size, multifunctionality, and/or low-cost characteristics, semiconductor devices are considered important elements in the electronic industry. The semiconductor devices may be classified into a memory device for storing data, a logic device for processing data, and a hybrid device including both of memory and logic elements. Due to the increased demand for electronic devices with fast speed and/or low power consumption, the semiconductor devices are needed to provide high reliability, high performance, and/or multiple functions. To satisfy these technical requirements, complexity and/or integration density of semiconductor devices are being increased.

An image sensor is a device that converts optical images into electrical signals. With increased development of the computer and communications industries, there is an increased demand for high performance image sensors in a variety of applications such as digital cameras, camcorders, personal communication systems, gaming machines, security cameras, micro-cameras for medical applications, and/or robots.

The image sensors may be generally classified into charge coupled device (CCD) and complementary metal-oxide semiconductor (CMOS) image sensors. The CMOS image sensors are operated using a simple operation method and are configured to have signal processing circuits integrated on a single chip, and thus, it is possible to realize products including scaled CMOS image sensors. In addition, CMOS image sensors may operate with relatively low consumption power, and thus, they are applicable to a product with low battery capacity (e.g., portable electronic devices).

SUMMARY

Some embodiments of the inventive concept provide semiconductor devices having an I/O interconnection structure with improved structural stability and method of fabricating the same.

According to some embodiments, a semiconductor device includes a first sub chip including a first substrate, first metal layers on the first substrate, and a first via group between the first metal layers, the first via group including a plurality of vias electrically interconnecting the first metal layers. The device also includes a second sub chip including a second substrate, second metal layers on the second substrate, and a second via group between the second metal layers, the second via group including a plurality of vias electrically interconnecting the second metal layers. A connection layer is disposed between the first and second sub chips and includes a connection region electrically connecting the first metal layers to the second metal layers. A through via passes through the second substrate and is electrically connected to the second metal layers. At least one of the first via group, the second via group, and the connection region is laterally spaced apart from the through via. The device may further include an input/output (I/O) pad on a first surface of the second substrate, wherein the through via is electrically connected to the input/output pad and wherein the second metal layers are disposed on a second surface of the second substrate on an opposite side of the second substrate from the first surface.

In some embodiments, the connection region may be laterally spaced apart from the through via. The first via group and the second via group may substantially overlap. In some embodiments, at least one of the first via group or the second via group may substantially overlap the connection region. In some embodiments, at least one of the first via group or the second via group may substantially overlap the through via. In some embodiments, the first via group, the second via group, the connection region, and the through via may be laterally spaced apart. In further embodiments, the vias of the first via group may be stacked in a zigzag manner and the vias of the second via group may be stacked in a zigzag manner. In some embodiments, a diameter of the connection region may be greater than diameters of the vias and is less than a diameter of the through via.

According to some embodiments, the first and second sub chips may form a semiconductor chip having first and second surfaces on opposite sides of the semiconductor chip. The first and second substrates may be disposed adjacent respective ones of the first and second surfaces. The device may further include an insulating layer interposed between the first and second sub chips and the connection region may be disposed in the insulating layer. The connection region may include a first connection pattern adjacent the first sub chip and a second connection pattern adjacent the second sub chip and in direct contact with the first connection pattern. Each of the first and second connection patterns may include at least one of copper (Cu) or tungsten (W).

In some embodiments, the first sub chip may be a logic chip and the second sub chip may be a memory chip. In some embodiments, the first sub chip may be a logic chip and the second sub chip may be a pixel array chip. In still further embodiments, the second sub may include at least one photoelectric conversion device.

The device may further include an input/output pad disposed on a first surface of the second substrate and at least one micro lens disposed on the first surface of the second substrate and laterally spaced apart from the input/output pad. The through via may be electrically connected to the input/output pad and the second metal layers may be disposed on a second surface of the second substrate on an opposite side of the second substrate from the first surface.

Further embodiments of the inventive concept provide a semiconductor device including a first sub chip including a first substrate and first metal layers on the first substrate, a second sub chip including a second substrate and second metal layers on the second substrate and a connection region disposed between the first and second sub chips and electrically connecting the first metal layers to the second metal layers. A through via penetrates the second substrate and is electrically connected to the second metal layers. The first metal layers, the connection region, and the second metal layers are interposed between the first substrate and the second substrate. The connection region is laterally spaced apart from the through via.

In some embodiments, the first sub chip may further include a first via group including a plurality of vias electrically interconnecting the first metal layers and the second sub chip may further include a second via group including a plurality of vias electrically interconnecting the second metal layers. The first via group and the second via group may substantially overlap. All of the first via group, the second via group, the connection region, and the through via may be laterally spaced apart.

The device may further include an input/output pad electrically connected to the second metal layers through the through via. The second substrate may include a first surface and a second surface on a side of the second substrate opposite the first surface. The input/output pad may be disposed on the first surface and the second metal layers may be disposed on the second surface.

In some embodiments, the device may further include an insulating layer interposed between the first and second sub chips. The connection region may be disposed in the insulating layer. A metal diffusion barrier layer may be disposed on the insulating layer.

Further embodiments provide a device including a first sub chip including a first substrate and a first interlayer insulating layer on the first substrate and a second sub chip stacked on the first sub chip and including a second substrate and a second interlayer insulating layer on the second substrate. A through via penetrates the second substrate. The device further includes an intervening layer disposed between and electrically interconnecting the first and second sub chips, the intervening layer including an insulating layer interposed between the first and second interlayer insulating layers and a connection region in the insulating layer and electrically connected to the through via. The connection region is laterally spaced apart from the through via.

In some embodiments, the second sub chip may include a plurality of metal layers and vias that are disposed between the through via and the connection region. The connection region may be electrically connected to the through via through the metal layers and the vias. The device may further include a third sub chip stacked on the second sub chip. The through via may extend from the second substrate to penetrate the third sub chip.

Further embodiments provide methods of fabricating a semiconductor device. First metal layers and a first via group are formed on a first substrate, the first via group including a plurality of vias that electrically interconnect the first metal layers. A first connection pattern is formed on the first metal layers. Second metal layers and a second via group are formed on a second substrate, the second via group including a plurality of vias that electrically interconnect the second metal layers. A second connection pattern is formed on the second metal layers. The first and second substrates are stacked to bring the first and second connection patterns in contact and form a connection region. A hole is formed exposing a portion of the second metal layers. The hole is laterally spaced apart from at least one of the first via group, the second via group, and the connection region. A through via is formed in the hole. The methods may further include forming an input/output pad on a first surface of the second substrate and electrically connected to the through via, wherein the second metal layers are formed on a second surface on an opposite side of the second substrate. In some embodiments, the hole is laterally spaced apart from the connection region.

Still further embodiments provide a device including a first integrated circuit substrate including a plurality of first metal layers interconnected by first vias and a second integrated circuit substrate on the first integrated circuit substrate and including second metal layers interconnected by second vias. The device also includes an insulation layer disposed between the first and second integrated circuit substrates and a connection region in the insulation layer and electrically connecting a first one of the first metal layers to a first one of the second metal layers. The device further includes a bonding pad on the second integrated circuit substrate and a through via extending from the bonding pad and into the second integrated circuit substrate to contact a second one of the second metal layers. The through via is positioned so as to not overlap at least one of the first vias, the second vias and the connection region.

In some embodiments, the through via does not overlap any of the first and second vias and none of the first vias overlap any of the second vias. In some embodiments, none of the first vias overlaps the connection region and the connection region does not overlap any of the second vias.

In further embodiments, the through via does not overlap any of the first and second vias and at least one of the first vias overlaps at least one of the second vias. In still further embodiments, none of the first vias overlaps the connection region and the connection region does not overlap any of the second vias. In some embodiments, at least one of the first vias overlaps the connection region and the connection region overlaps at least one of the second vias.

In still further embodiments, the through via may overlap at least one of the first vias and none of the first vias overlaps the connection region. In some embodiments, the through via may overlap the connection region.

In further method embodiments, methods of fabricating a semiconductor device include forming a first integrated circuit substrate including a plurality of first metal layers interconnected by first vias and forming a first connection layer on the first integrated circuit substrate and including a first insulation layer with a first connection region therein in contact with a first one of the first metal layers. The methods further include forming a second integrated circuit substrate on the first integrated circuit substrate and including second metal layers interconnected by second vias and forming a second connection layer on the second integrated circuit substrate and including a second insulation layer with a second connection region therein in contact with a first one of the second metal layers. The first and second integrated circuit substrates are stacked to bring the first and second connection patterns in contact and form a connection region. A through via is formed extending from the bonding pad and into the second integrated circuit to contact a second one of the second metal layers. The through via is positioned so as to not overlap at least one of the first vias, the second vias and the connection region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
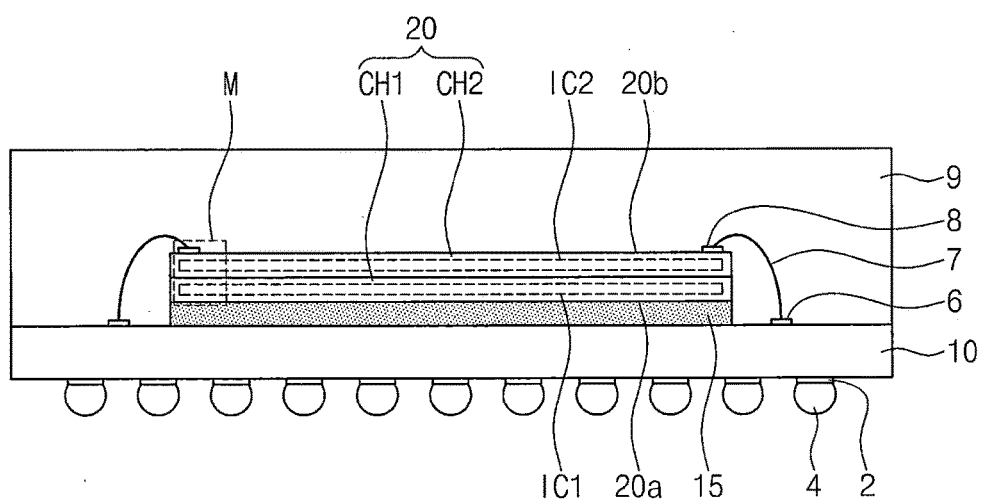
FIG. 1 is a sectional view illustrating a semiconductor package according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Exemplary embodiments of the present inventive concepts explained and illustrated herein include their complementary counterparts. The same reference numerals or the same reference designators denote the same elements throughout the specification.

FIG. 1 is a sectional view illustrating a semiconductor package according to some embodiments of the inventive concept.

Referring to FIG. 1, a semiconductor chip 20 may be mounted on a package substrate 10. As an example, the package substrate 10 may be a printed circuit board (PCB). The package substrate 10 may include circuit patterns (not shown) provided on one or both of top and bottom surfaces thereof. At least one of the circuit patterns may be electrically connected to first outer pads 2, which may be provided on the bottom surface of the package substrate 10. Outer terminals 4 (e.g., solder bumps or solder balls) may be respectively attached on the first outer pads 2 to electrically connect the package substrate 10 to an external device. At least one other of the circuit patterns may be electrically connected to second outer pads 6, which may be provided on the top surface of the package substrate 10.

The semiconductor chip 20 may have a first surface 20a facing the package substrate 10, and a second surface 20b opposite to the first surface 20a. In some embodiments, the semiconductor chip 20 may include a first sub chip CH1 and a second sub chip CH2 vertically stacked on the package substrate 10. The first and second sub chips CH1 and CH2 may be coupled physically and electrically to each other in wafer level, thereby constituting the semiconductor chip 20. The first sub chip CH1 may include a first integrated circuit IC1, and the second sub chip CH2 may include a second integrated circuit IC2.

Bonding pads 8 may be provided on the second surface 20b of the semiconductor chip 20. The bonding pads 8 may be electrically connected to the first and second integrated circuits IC1 and IC2. In other words, the bonding pads 8 may be configured to allow signals to be applied to or received from the first and second integrated circuits IC1 and IC2 therethrough.

The semiconductor chip 20 may be attached to the package substrate 10 using an adhesive layer 15. The adhesive layer 15 may be interposed between the first surface 20a of the semiconductor chip 20 and the top surface of the package substrate 10. The adhesive layer 15 may be an insulating layer or tape (e.g., containing an epoxy or silicone-based material).

Wires 7 may be provided to electrically connect the bonding pads 8 of the semiconductor chip 20 to the second outer pads 6 of the package substrate 10, respectively. The semiconductor chip 20 may communicate with an external controller (not shown) through the wires 7. The wires 7 may be used to transmit various data, such as control signals containing address and command data, voltage signals, and any other data, to the semiconductor chip 20 from the controller.

A mold layer 9 on the package substrate 10 may cover the semiconductor chip 20 and the wires 7. The mold layer 9 may protect the semiconductor chip 20 and the wires 7 against exterior environment. The mold layer 9 may include an epoxy molding compound (EMC).

Figure 2:
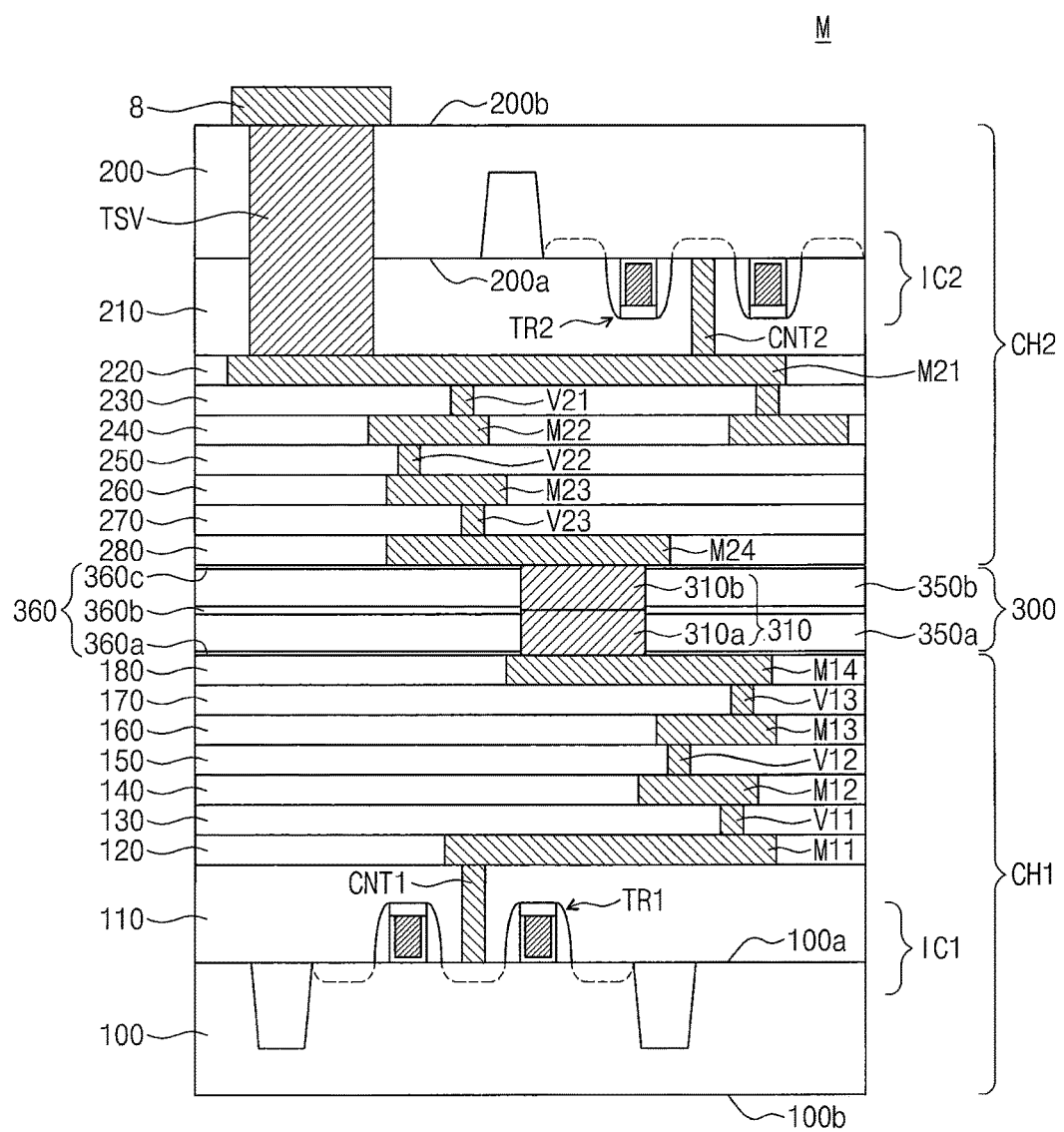
FIG. 2 is an enlarged sectional view illustrating a portion (e.g., corresponding to a region 'M' of FIG. 1) of a semiconductor chip according to some embodiments of the inventive concept.

FIG. 2 is an enlarged sectional view illustrating a portion (e.g., corresponding to a region 'M' of FIG. 1) of a semiconductor chip according to some embodiments of the inventive concept. Referring to FIGS. 1 and 2, the semiconductor chip 20 may include the first sub chip CH1, the second sub chip CH2, and an intervening layer 300 between the first and second sub chips CH1 and CH2. The first sub chip CH1 and the second sub chip CH2 may be vertically stacked, and the intervening layer 300 may be provided to physically and electrically interconnect the first and second sub chips CH1 and CH2.

The first sub chip CH1 may include a first integrated circuit IC1, and the second sub chip CH2 may include a second integrated circuit IC2. As an example, the first sub chip CH1 may be a logic chip. The first integrated circuit IC1 may include logic cells for processing data and a control and/or power circuit for controlling operations of the logic cells. In some embodiments, the second sub chip CH2 may be one of memory chips (e.g., DRAM chips or FLASH memory chips). The second integrated circuit IC2 may include memory cells for storing data and a control and/or power circuit for controlling operations of the memory cells.

The first sub chip CH1 may include a first substrate 100, lower interlayer insulating layers 110-180, lower metal layers M11-M14, and a lower via group V11-V13. The first substrate 100 may have a top surface 100a and a bottom surface 100b. The bottom surface 100b may be the first surface 20a of the semiconductor chip 20 shown in FIG. 1. The first substrate 100 may be a silicon substrate, a germanium substrate, or a silicon-germanium substrate.

The first integrated circuit IC1 may be disposed on the top surface 100a of the first substrate 100. The first integrated circuit IC1 may include a plurality of first transistors TR1. The first transistors TR1 may constitute the logic cells. Each of the first transistors TR1 may include a gate electrode and impurity regions, which are disposed at both sides of the gate electrode. The impurity regions may be formed in the first substrate 100 and may be doped with impurities. Furthermore, a device isolation layer may be provided on or in the first substrate 100 to be adjacent to the first transistors TR1.

The lower interlayer insulating layers 110-180 may be stacked on the top surface 100a of the first substrate 100. The lower interlayer insulating layers 110-180 may be formed of or include silicon oxide, for example. The first lower interlayer insulating layer 110 may be provided to cover the first transistors TR1. At least one first contact CNT1 may be provided to pass through the first lower interlayer insulating layer 110 and may be connected to one of the impurity regions of the first transistors TR1.

A first lower metal layer M11, a second lower metal layer M12, a third lower metal layer M13, and a fourth lower metal layer M14 may be provided in a second lower interlayer insulating layer 120, a fourth lower interlayer insulating layer 140, a sixth lower interlayer insulating layer 160, and an eighth lower interlayer insulating layer 180, respectively. The lower via group V11-V13 may include first to third lower vias V11, V12, and V13. The first to third lower vias V11, V12, and V13 may be disposed in the third lower interlayer insulating layer 130, the fifth lower interlayer insulating layer 150, and seventh lower interlayer insulating layer 170, respectively. The first to third lower vias V11, V12, and V13 may be provided to vertically connect the lower metal layers M11-M14.

In some embodiments, the lower via group V11-V13 may be a group of a plurality of via plugs (e.g., the first to third lower vias V11, V12, and V13) vertically connecting the first transistors TR1 to a connection region 310 of an intervening layer 300. In other words, an input/output (I/O) signal applied to the connection region 310 may be transmitted to the first transistors TR1 through the lower via group V11-V13.

The first to third lower vias V11, V12, and V13 may be stacked in a zigzag manner. In other words, vertically adjacent pair of the lower vias may be disposed in such a way that they do not overlap. For example, the first and second lower vias V11 and V12 may not be overlapped with each other, and the second and third lower vias V12 and V13 may not overlap.

The first lower metal layer M11 may be electrically connected to the first contact CNT1. Accordingly, the lower metal layers M11-M14 may be electrically connected to the first transistors TR1. As an example, the lower metal layers M11-M14 and the lower via group V11-V13 may include a metallic material (e.g., copper (Cu) or tungsten (W)).

As an example, although not shown, at least one metal diffusion barrier layer may be disposed in the lower interlayer insulating layers 110-180. The metal diffusion barrier layer may include, for example, SiN, SiCN, SiOCN, SiON, or SiC. The metal diffusion barrier layer may prevent metallic elements from being diffused from the lower metal layers M11-M14 and the lower via group V11-V13.

The second sub chip CH2 may include a second substrate 200, upper interlayer insulating layers 210-280, upper metal layers M21-M24, and an upper via group V21-V23. The second substrate 200 may have a top surface 200a and a bottom surface 200b. The bottom surface 200b may be the second surface 20b of the semiconductor chip 20 shown in FIG. 1. The second substrate 200 may be a silicon substrate, a germanium substrate, or a silicon-germanium substrate.

The second integrated circuit IC2 may be disposed on the top surface 200a of the second substrate 200. The second integrated circuit IC2 may include a plurality of second transistors TR2. The second transistors TR2 may constitute the memory cells. Each of the second transistors TR2 may include a gate electrode and impurity regions, which are disposed at both sides of the gate electrode. The impurity regions may be formed in the second substrate 200 and may be doped with impurities. Furthermore, a device isolation layer may be formed in the second substrate 200 to be adjacent to the second transistors TR2.

The upper interlayer insulating layers 210-280 may be stacked on the top surface 200a of the second substrate 200. The upper interlayer insulating layers 210-280 may be formed of or include silicon oxide, for example. The first upper interlayer insulating layer 210 may be provided to cover the second transistors TR2. At least one second contact CNT2 may be provided to pass through the first upper interlayer insulating layer 210 and may be connected to one of the impurity regions of the second transistors TR2.

A first upper metal layer M21, a second upper metal layer M22, a third upper metal layer M23, and a fourth upper metal layer M24 may be provided in a second upper interlayer insulating layer 220, a fourth upper interlayer insulating layer 240, a sixth upper interlayer insulating layer 260, and an eighth upper interlayer insulating layer 280, respectively. The upper via group V21-V23 may include first to third upper vias V21, V22, and V23. The first to third upper vias V21, V22, and V23 may be provided in a third upper interlayer insulating layer 230, a fifth upper interlayer insulating layer 250, and a seventh upper interlayer insulating layer 270, respectively. The first to third upper vias V21, V22, and V23 may be provided to vertically connect the upper metal layers M21-M24.

In some embodiments, the upper via group V21-V23 may be a group of a plurality of via plugs (e.g., the first to third upper vias V21, V22, and V23) vertically connecting the connection region 310 to a through via TSV (to be described below). In other words, an I/O signal applied to the through via TSV may be transmitted to the connection region 310 through the upper via group V21-V23.

The first to third upper vias V21, V22, and V23 may be stacked in a zigzag manner. In other words, vertically adjacent pair of the upper vias may be disposed in such a way that they do not overlap. For example, the first and second upper vias V21 and V22 may not overlap, and the second and third upper vias V22 and V23 may not overlap.

The first upper metal layer M21 may be electrically connected to the second contact CNT2. Accordingly, the upper metal layers M21-M24 may be electrically connected to the second transistors TR2. As an example, the upper metal layers M21-M24 and the upper via group V21-V23 may include a metallic material (e.g., copper (Cu) or tungsten (W)).

As an example, although not shown, at least one metal diffusion barrier layer may be provided in the upper interlayer insulating layers 210-280. The metal diffusion barrier layer may prevent metallic elements from being diffused from the upper metal layers M21-M24 and the upper via group V21-V23.

The intervening layer 300 may include the connection region 310 electrically connecting the lower metal layers M11-M14 to the upper metal layers M21-M24. The connection region 310 may include metal (e.g., copper (Cu) and tungsten (W)).

In some embodiments, the connection region 310 may include a first connection pattern 310a electrically connected to at least one of the lower metal layers M11-M14 and a second connection pattern 310b electrically connected to at least one of the upper metal layers M21-M24. As an example, the first connection pattern 310a may be connected to the uppermost layer (e.g., the fourth lower metal layer M14) of the lower metal layers M11-M14, and the second connection pattern 310b may be connected to the lowermost layer (e.g., the fourth upper metal layer M24) of the upper metal layers M21-M24. The first connection pattern 310a and the second connection pattern 310b may be in direct contact with each other, thereby forming an electrically-connected signal path.

The intervening layer 300 may further include an insulating layer 350. The connection region 310 may be disposed to pass through the insulating layer 350. In some embodiments, the insulating layer 350 may include a first insulating layer 350a and a second insulating layer 350b. The first connection pattern 310a may be disposed in the first insulating layer 350a and the second connection pattern 310b may be disposed in the second insulating layer 350b. The insulating layer 350 may include, for example, a silicon oxide layer.

At least one metal diffusion barrier layer 360 may be provided in the insulating layer 350. As an example, the at least one metal diffusion barrier 360 layer may include a first metal diffusion barrier layer 360a disposed below the first insulating layer 350a, a third metal diffusion barrier layer 360c disposed on the second insulating layer 350b, and a second metal diffusion barrier layer 360b disposed between the first and second insulating layers 350a and 350b. The diffusion barrier layers 360a, 360b, 360c may include, for example, SiN, SiCN, SiOCN, SiON, or SiC. The at least one metal diffusion barrier layer 360 may suppress metallic elements from being diffused from the connection region 310.

The semiconductor chip 20 may further include at least one through via TSV passing through the second substrate 200. The through via TSV may penetrate the second substrate 200 from the bottom surface 200b to the top surface 200a. Furthermore, the through via TSV may extend to further penetrate a portion (e.g., the first upper interlayer insulating layer 210) of the upper interlayer insulating layers 210-280. The through via TSV may be electrically connected to at least one of the upper metal layers M21-M24. As an example, the through via TSV may be connected to the uppermost layer (e.g., the first upper metal layer M21) of the upper metal layers M21-M24. The through via TSV may be formed of or include a metallic material (e.g., copper (Cu) and tungsten (W)).

The through via TSV may have a greater cross-sectional area than the lower via group V11-V13, the upper via group V21-V23, and/or the connection region 310. For example, a diameter of the through via TSV may be larger than that of the connection region 310.

In some embodiments, when viewed in plan view, at least one of the lower via group V11-V13, the upper via group V21-V23, and the connection region 310 may be laterally (i.e., along a direction parallel to the substrates 100, 200) spaced apart from the through via TSV. In other words, at least one of the lower via group V11-V13, the upper via group V21-V23, and the connection region 310 may not overlap with the through via TSV in plan view.

As an example, in plan view, the lower via group V11-V13, the upper via group V21-V23, the connection region 310, and the through via TSV may be laterally spaced apart from each other. In some embodiments, in plan view, the through via TSV may be laterally spaced apart from all of the via plugs (e.g., the first to third upper vias V21, V22, and V23) constituting the upper via group V21-V23. In plan view, the connection region 310 may be laterally spaced apart from the via plugs of the upper via group V21-V23. Furthermore, in plan view, the connection region 310 may be laterally spaced apart from the via plugs (e.g., the first to third lower vias V11, V12, and V13) of the lower via group V11-V13. The through via TSV may be laterally spaced apart from the connection region 310 in plan view.

Figure 3:
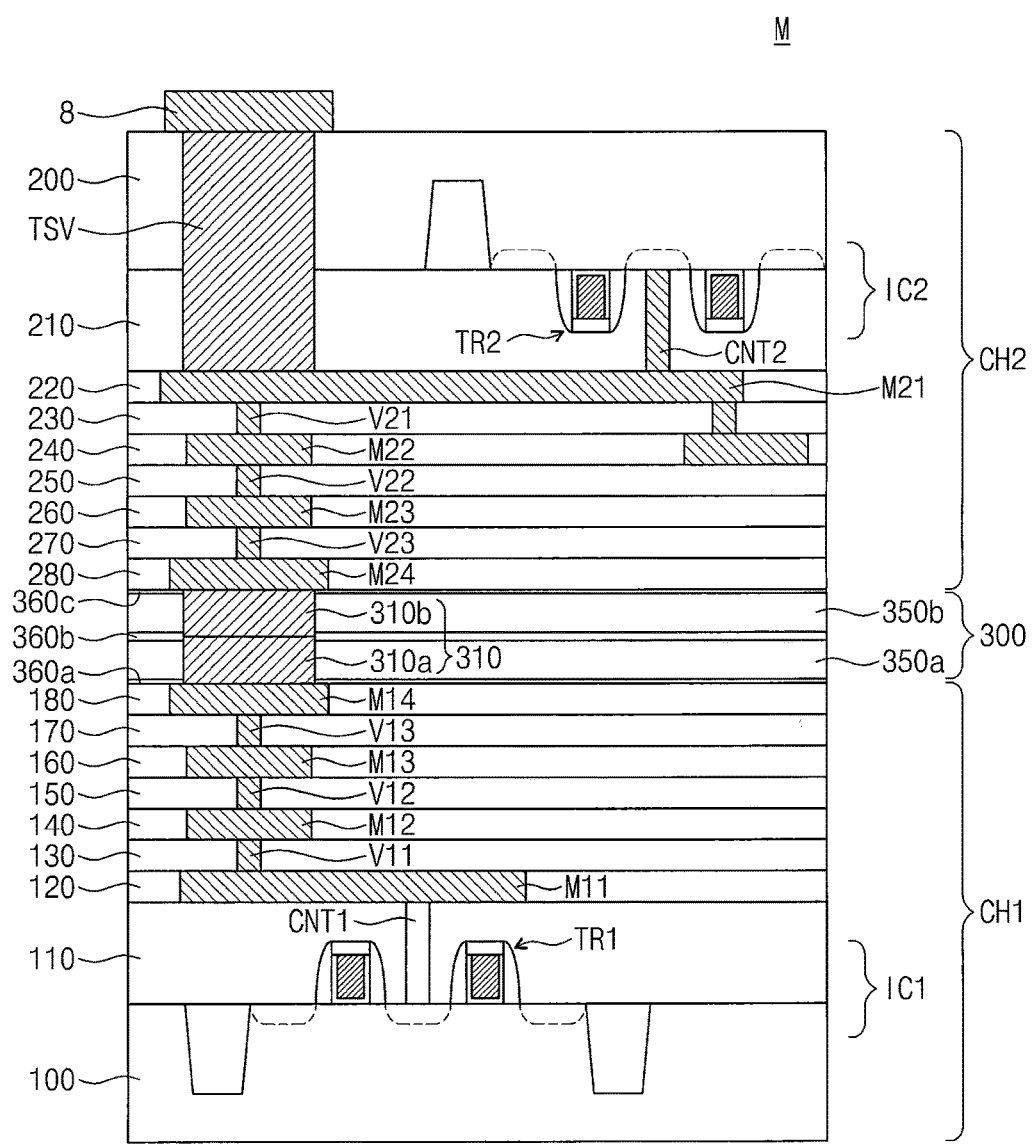
FIG. 3 is an enlarged sectional view illustrating a portion (e.g., corresponding to a region 'M' of FIG. 1) of a semiconductor chip according to a comparative example.

FIG. 3 is an enlarged sectional view illustrating a portion (e.g., corresponding to a region 'M' of FIG. 1) of a semiconductor chip according to a comparative example. Referring to FIGS. 1 and 3, lower via group V11-V13, upper via group V21-V23, connection region 310, and through via TSV may overlap in plan view. Furthermore, the first to third lower vias V11, V12, and V13 may be aligned, and the first to third upper vias V21, V22, and V23 may be aligned. The upper via group V21-V23 overlapping the through via TSV means that at least one of via plugs constituting the upper via group V21-V23 overlaps the through via TSV in plan view. This is the same for the lower via group V11-V13.

When the semiconductor chip 20 is operated, an inner temperature of the semiconductor chip 20 may be increased and cause expansion of metallic components provided in the semiconductor chip 20. Here, since the through via TSV and the connection region 310 have relatively large volumes, expansion of the through via TSV and the connection region 310 may exert a mechanical stress on neighboring components. In the arrangement shown in FIG. 3, where the lower via group V11-V13, the upper via group V21-V23, the connection region 310 and the through via TSV are vertically stacked an overlap, the mechanical stress may reach a level great enough to cause deterioration in electrical or physical characteristics of the semiconductor chip 20.

Referring back to FIGS. 1 and 2, the semiconductor chip 20 according to some embodiments of the inventive concept may be configured in such a way that at least one of the lower via group V11-V13, the upper via group V21-V23, and the connection region 310 do not overlap the largest through via TSV, unlike the arrangement described with reference to FIG. 3. The arrangement illustrated in FIG. 2 may distribute or reduce the stress and thereby improve structural stability of the semiconductor chip 20. This can reduce or prevent deterioration of the semiconductor device and improve reliability of the semiconductor device.

A bonding pad 8 may be disposed on the bottom surface 200b of the second substrate 200. For example, the bonding pad 8 may be a contact to which I/O signals are applied. The bonding pad 8 may be electrically connected to the through via TSV. Accordingly, the I/O signal applied to the bonding pad 8 may be transmitted to the second integrated circuit IC2 through the through via TSV and the upper metal layers M21-M24. The I/O signal applied to bonding pad 8 may be transmitted to the first integrated circuit IC1 through the through via TSV, the upper metal layers M21-M24, the upper via group V21-V23, the connection region 310, the lower metal layers M11-M14, and the lower via group V11-V13.

FIGS. 4A through 4D are sectional views illustrating operations for fabricating a semiconductor chip. For concise description, an element previously described with reference to FIGS. 1 and 2 may be identified by a similar or identical reference number, and repeated description thereof may be omitted.

Figure 4A:
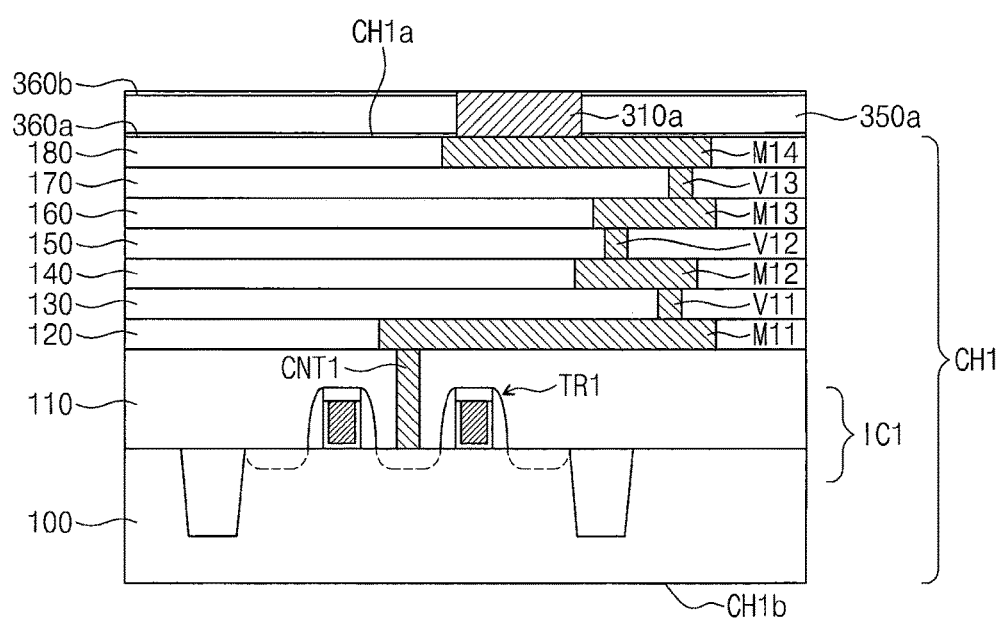
FIGS. 4A through 4D are sectional views illustrating operations for fabricating a semiconductor chip.

Referring to FIG. 4A, the first sub chip CH1 may be prepared. In some embodiments, the first integrated circuit IC1 may be formed on the first substrate 100. Thereafter, the lower interlayer insulating layers 110-180 may be formed to cover the first integrated circuit IC1. The lower metal layers M11-M14 and the lower via group V11-V13 may be formed in the lower interlayer insulating layers 110-180.

The first sub chip CH1 may have a top surface CH1a and a bottom surface CH1b on opposite sides of the first sub chip CH1. The first insulating layer 350a may be formed on the top surface CH1a of the first sub chip CH1. The first connection pattern 310a may be formed in the first insulating layer 350a. The first connection pattern 310a may be electrically connected to at least one of the lower metal layers M11-M14. In addition, the first metal diffusion barrier layer 360a and the second metal diffusion barrier layer 360b may be respectively formed on bottom and top surfaces of the first insulating layer 350a.

Figure 4B:
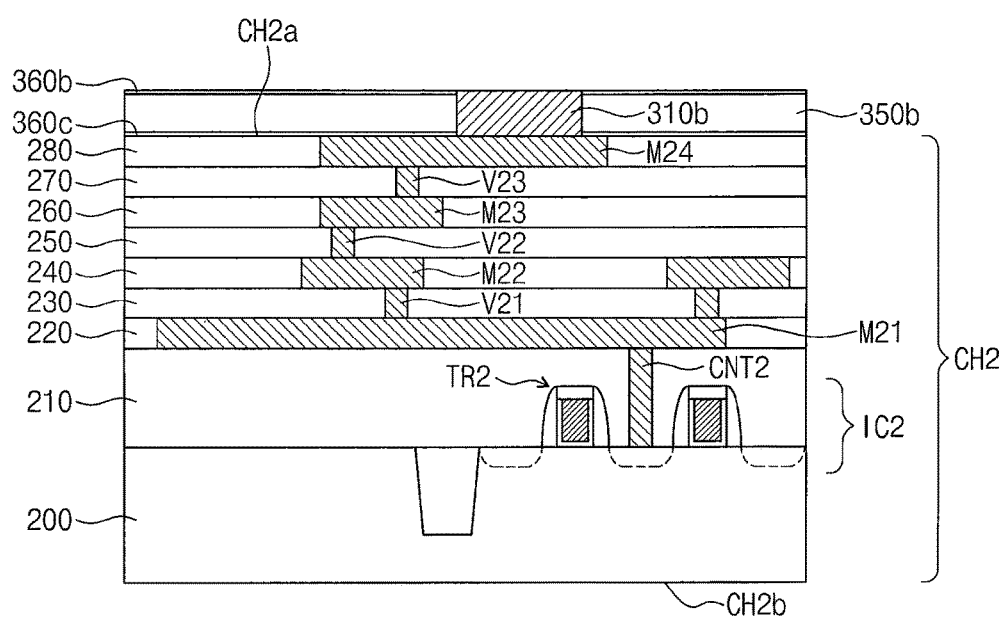

Referring to FIG. 4B, the second sub chip CH2 may be prepared. In some embodiments, the second integrated circuit IC2 may be formed on the second substrate 200. The upper interlayer insulating layers 210-280 may be formed to cover the second integrated circuit IC2. The upper metal layers M21-M24 and the upper via group V21-V23 may be formed in the upper interlayer insulating layers 210-280.

The second sub chip CH2 may have a top surface CH2a and a bottom surface CH2b on opposite sides of the second sub chip CH2. The second insulating layer 350b may be formed on the top surface CH2a of the second sub chip CH2. The second connection pattern 310b may be formed in the second insulating layer 350b. The second connection pattern 310b may be electrically connected to at least one of the upper metal layers M21-M24. The third metal diffusion barrier layer 360c and the second metal diffusion barrier layer 360b may be respectively formed under and on the second insulating layer 350b.

Figure 4C:
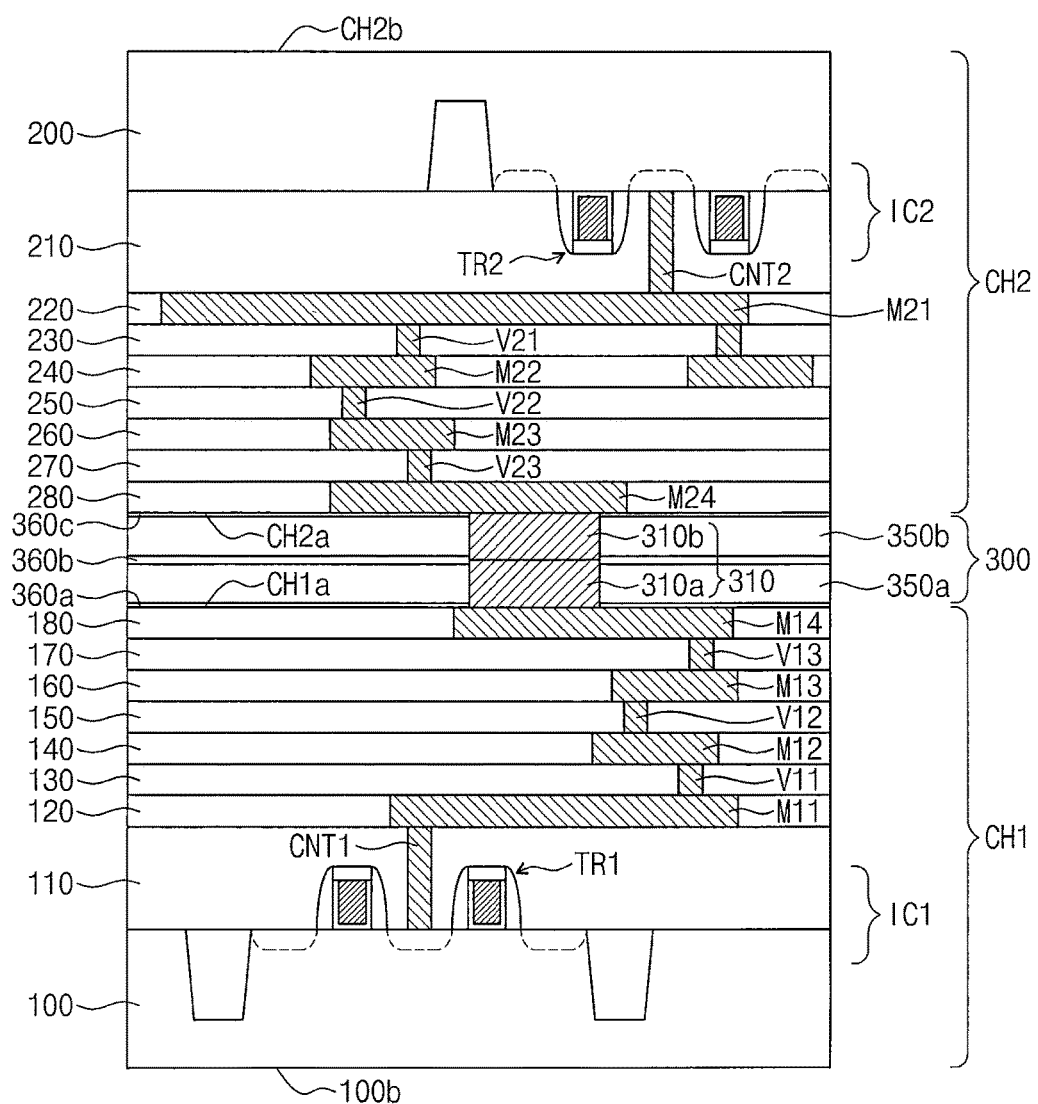

Referring to FIG. 4C, the first and second sub chips CH1 and CH2 may be stacked in such a way that the top surface CH1a of the first sub chip CH1 faces the top surface CH2a of the second sub chip CH2. The first connection pattern 310a and the second connection pattern 310b may be physically and electrically coupled to form the connection region 310. The first integrated circuit IC1 and the second integrated circuit IC2 may be electrically connected to each other through the connection region 310, the lower and upper metal layers M11-M14 and M21-M24, and the lower and upper via groups V11-V13 and V21-V23.

Figure 4D:
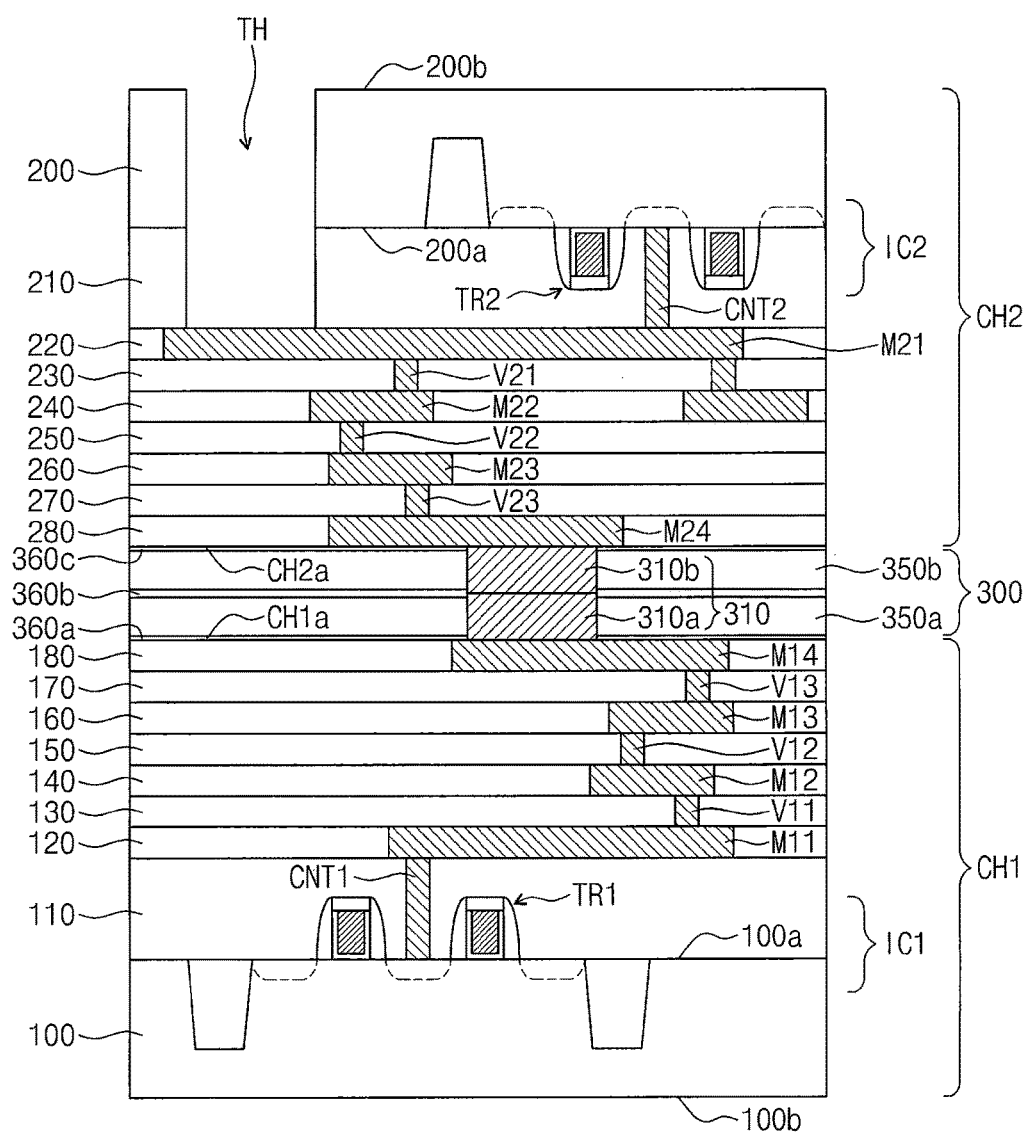

Referring to FIG. 4D, a through hole TH may be formed to penetrate the second substrate 200. The through hole TH may be formed through the second substrate 200. The through hole TH may also penetrate the first upper interlayer insulating layer 210 to expose the first upper metal layer M21.

In plan view, the through hole TH may be separated from at least one of the lower via group V11-V13, the upper via group V21-V23, and the connection region 310. For example, the through hole TH may not overlap any of the lower via group V11-V13, the upper via group V21-V23, and the connection region 310.

Referring back to FIG. 2, a conductive material (e.g., copper (Cu) or tungsten (W)) may be formed to fill the through hole TH, thereby forming the through via TSV. Thereafter, the bonding pad 8 may be formed on the through via TSV. For example, the bonding pad 8 may be formed on the bottom surface 200b of the second substrate 200 and electrically connected to the through via TSV.

FIGS. 5 through 8 are enlarged sectional views illustrating a portion (e.g., corresponding to a region 'M' of FIG. 1) of a semiconductor chip according to some embodiments of the inventive concept. For concise description, an element previously described with reference to FIGS. 1 and 2 may be identified by a similar or identical reference number, and repeated description thereof may be omitted.

Figure 5:
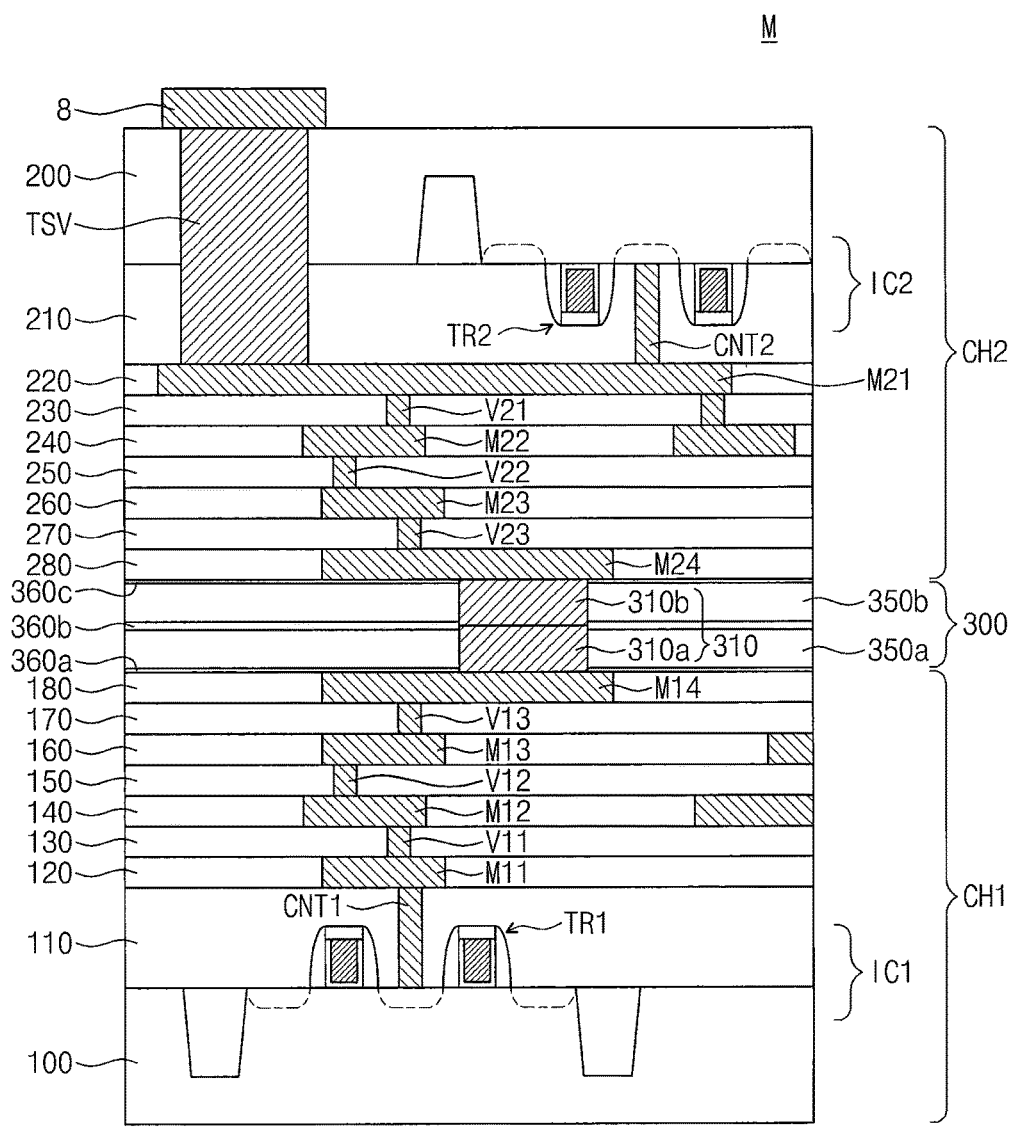
FIGS. 5 through 8 are enlarged sectional views illustrating a portion (e.g., corresponding to a region 'M' of FIG. 1) of a semiconductor chip according to some embodiments of the inventive concept.

Referring to FIGS. 1 and 5, when viewed in plan view, the upper via group V21-V23 and the lower via group V11-V13 may substantially overlap. However, when viewed in plan view, the lower and upper via groups V11-V13 and V21-V23 may not overlap with any of the through via TSV and the connection region 310. The upper via group V21-V23 and the lower via group V11-V13 overlapping means that that at least one of the via plugs of the upper via group V21-V23 overlaps at least one of the via plugs of the lower via group V11-V13 in plan view.

Figure 6:
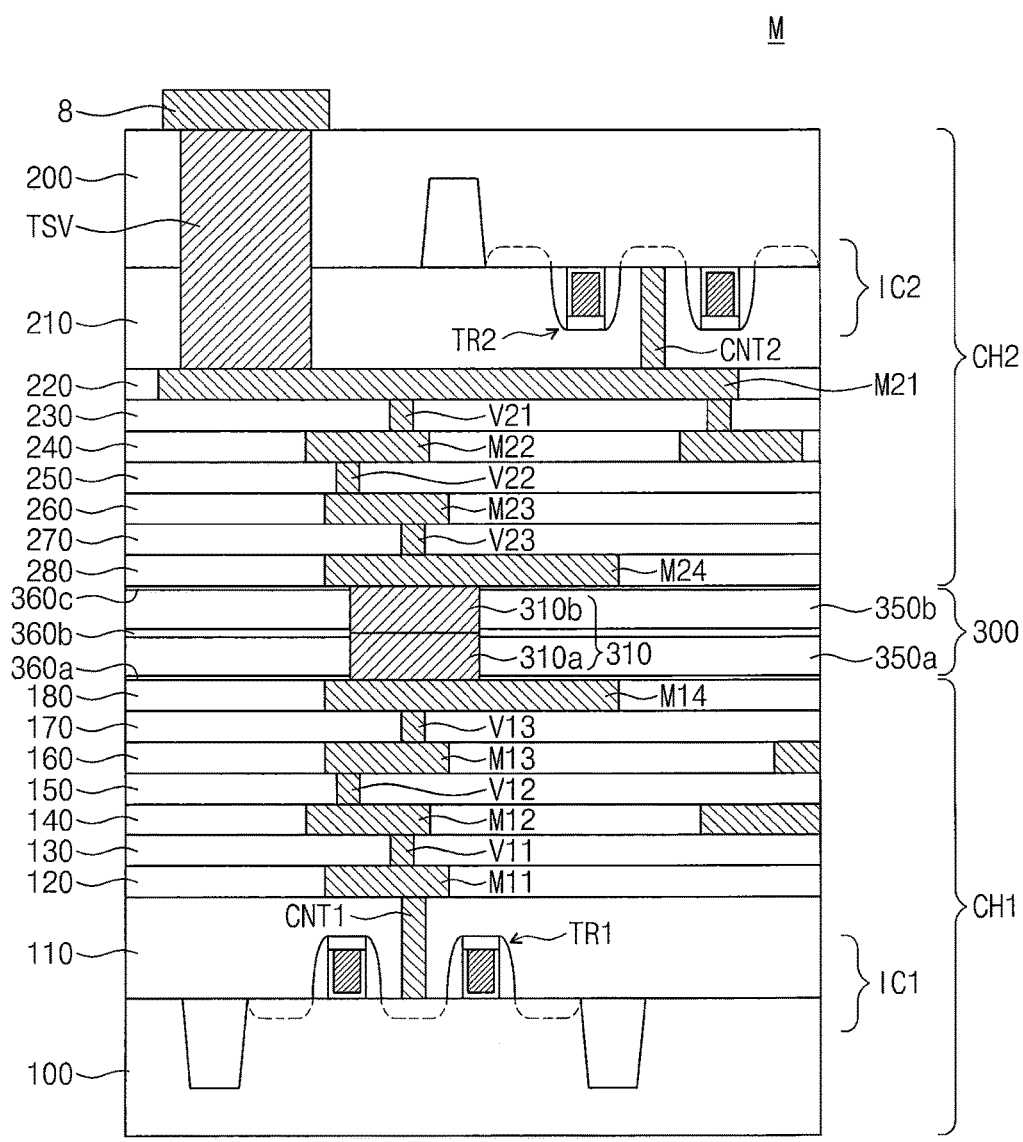

Referring to FIGS. 1 and 6, when viewed in plan view, the upper via group V21-V23, the connection region 310, and the lower via group V11-V13 may substantially overlap one another, but may not overlap the through via TSV.

Figure 7:
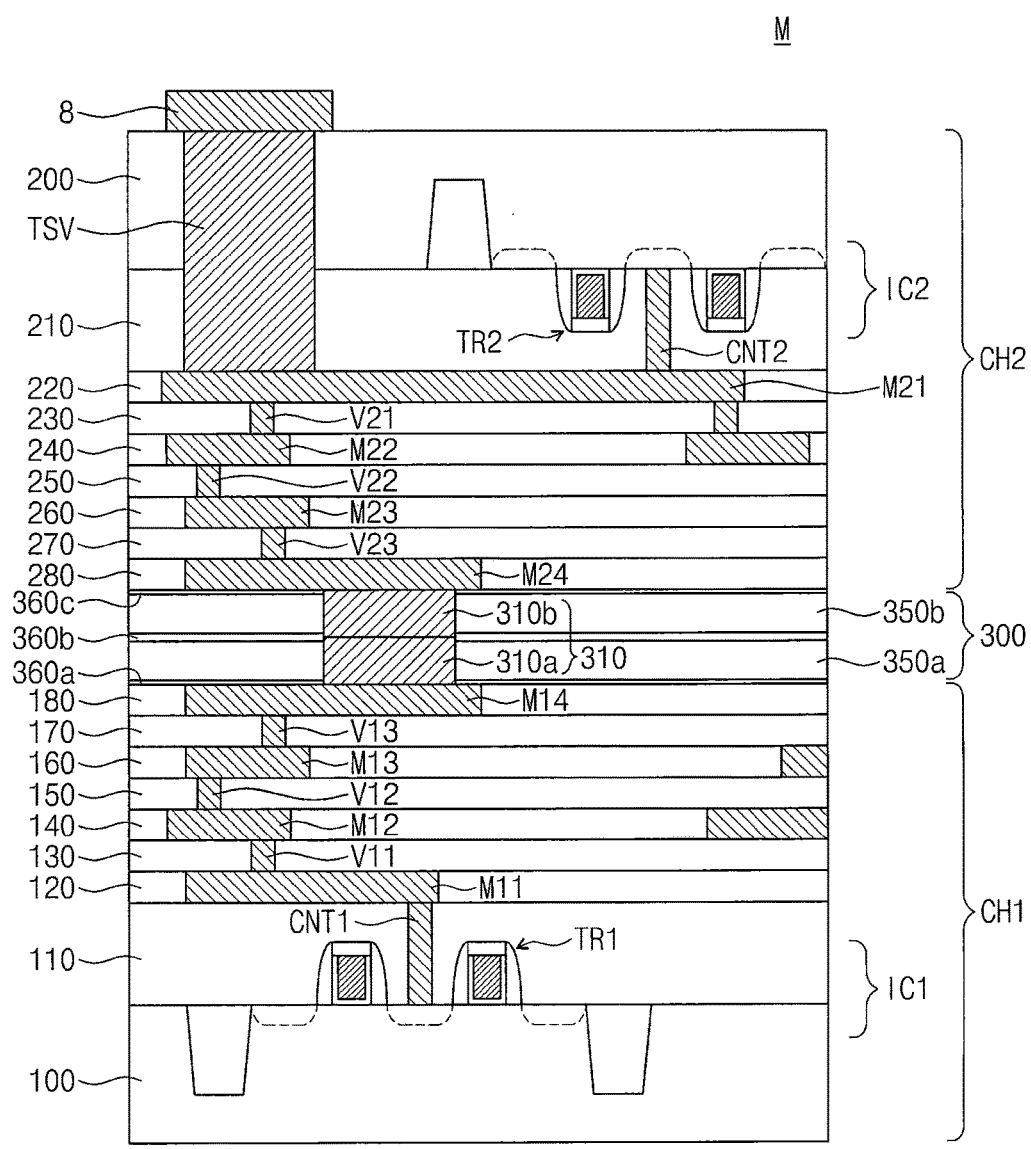

Referring to FIGS. 1 and 7, when viewed in plan view, the through via TSV, the upper via group V21-V23, and the lower via group V11-V13 may substantially overlap one another, but may not overlap the connection region 310.

Figure 8:
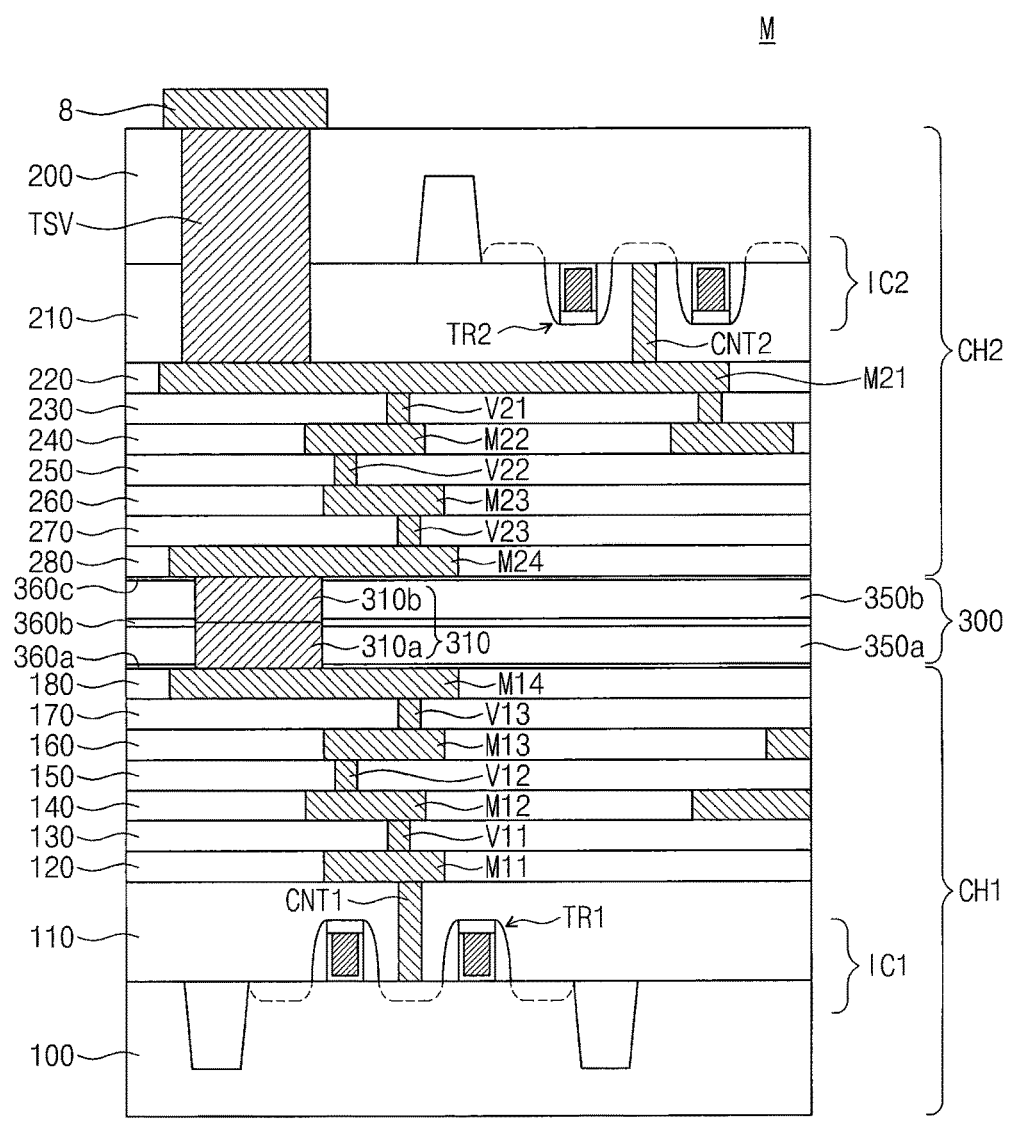

Referring to FIGS. 1 and 8, when viewed in plan view, the upper via group V21-V23 and the lower via group V11-V13 may substantially overlap. The through via TSV and the connection region 310 may also substantially overlap. However, the lower and upper via groups V11-V13 and V21-V23 may not overlap either of the through via TSV and the connection region 310

Figure 9:
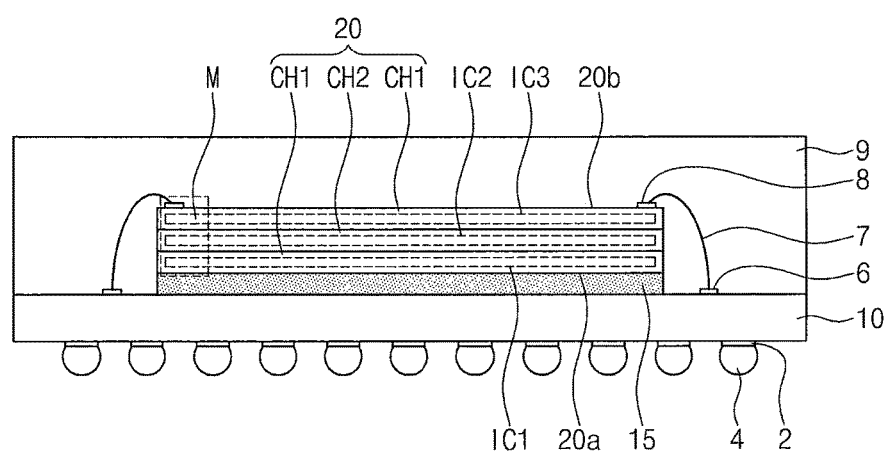
FIG. 9 is a sectional view illustrating a semiconductor package according to some embodiments of the inventive concept.
Figure 10:
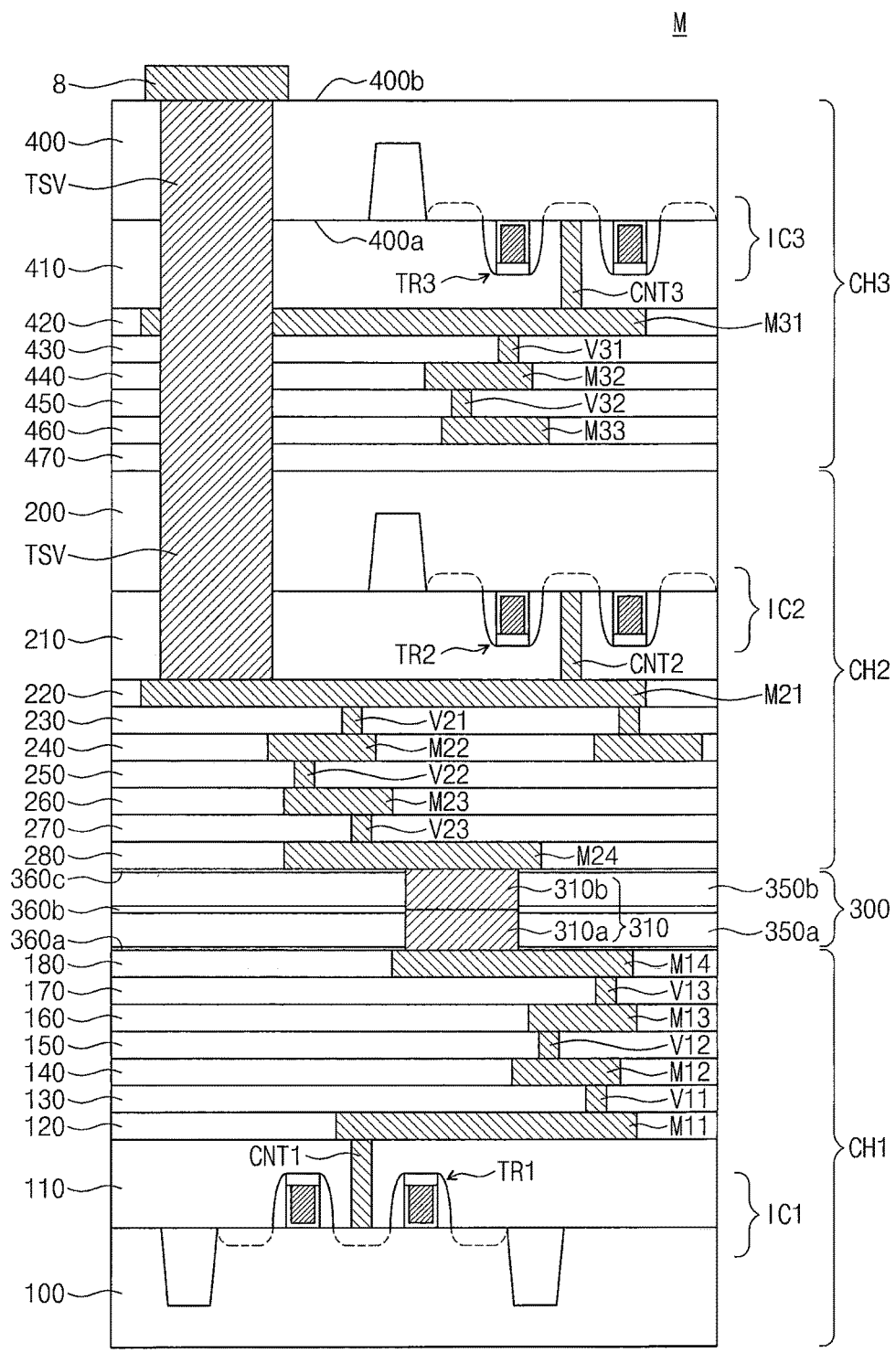
FIG. 10 is an enlarged sectional view illustrating a portion (e.g., corresponding to a region 'M' of FIG. 9) of a semiconductor chip according to some embodiments of the inventive concept.

FIG. 9 is a sectional view illustrating a semiconductor package according to some embodiments of the inventive concept. FIG. 10 is an enlarged sectional view illustrating a portion (e.g., corresponding to a region 'M' of FIG. 9) of a semiconductor chip according to some embodiments of the inventive concept. For concise description, an element previously described with reference to FIGS. 1 and 2 may be identified by a similar or identical reference number, and repeated description thereof may be omitted.

Referring to FIGS. 9 and 10, the semiconductor chip 20 may be mounted on the package substrate 10. In some embodiments, the semiconductor chip 20 may include the first to third sub chips CH1, CH2, and CH3, which are vertically stacked. The first to third sub chips CH1, CH2, and CH3 may be physically and electrically coupled to each other in wafer level, thereby constituting the semiconductor chip 20. The first sub chip CH1 may include the first integrated circuit IC1, the second sub chip CH2 may include the second integrated circuit IC2, and the third sub chip CH3 may include a third integrated circuit IC3. As an example, the third sub chip CH3 may be a memory chip (e.g., DRAM or FLASH). The third integrated circuit IC3 may include memory cells for storing data and control and/or power circuits for controlling operations of the memory cells.

In some embodiments, the third sub chip CH3 may be disposed on the second substrate 200 of the second sub chip CH2. The third sub chip CH3 may include a third substrate 400, additional interlayer insulating layers 410-470, additional metal layers M31-M33, and an additional via group V31 and V32. The third integrated circuit IC3 may be disposed on a top surface 400a of the third substrate 400. The third integrated circuit IC3 may include a plurality of third transistors TR3. At least one third contact CNT3 may be connected to at least one of the third transistors TR3 through the first additional interlayer insulating layer 410. The lowermost layer (e.g., 470) of the additional interlayer insulating layers 410-470 may be directly coupled to the second substrate 200.

The semiconductor chip 20 may further include at least one through via TSV passing through the third sub chip CH3 and the second substrate 200. The through via TSV may pass through the third sub chip CH3 and electrically connect to at least one of the additional metal layers M31-M33. For example, the through via TSV may be connected to the uppermost layer (e.g., the first additional metal layer M31) of the additional metal layers M31-M33. The through via TSV may further penetrate the second substrate 200 and the first upper interlayer insulating layer 210 and electrically connect to at least one of the upper metal layers M21-M24. Accordingly, the third sub chip CH3 and the second sub chip CH2 may be electrically connected to each other through the through via TSV.

The bonding pad 8 may be disposed on a bottom surface 400b of the third substrate 400. For example, the bonding pad 8 may serve as the I/O pad, to which the I/O signal is applied. The bonding pad 8 may be electrically connected to the through via TSV.

A semiconductor chip including three sub chips CH1, CH2 and CH3 is described as an example of some embodiments of the inventive concept, but the inventive concept is not limited thereto. For example, additional sub chips may be further stacked on the third sub chip CH3.

Figure 11:
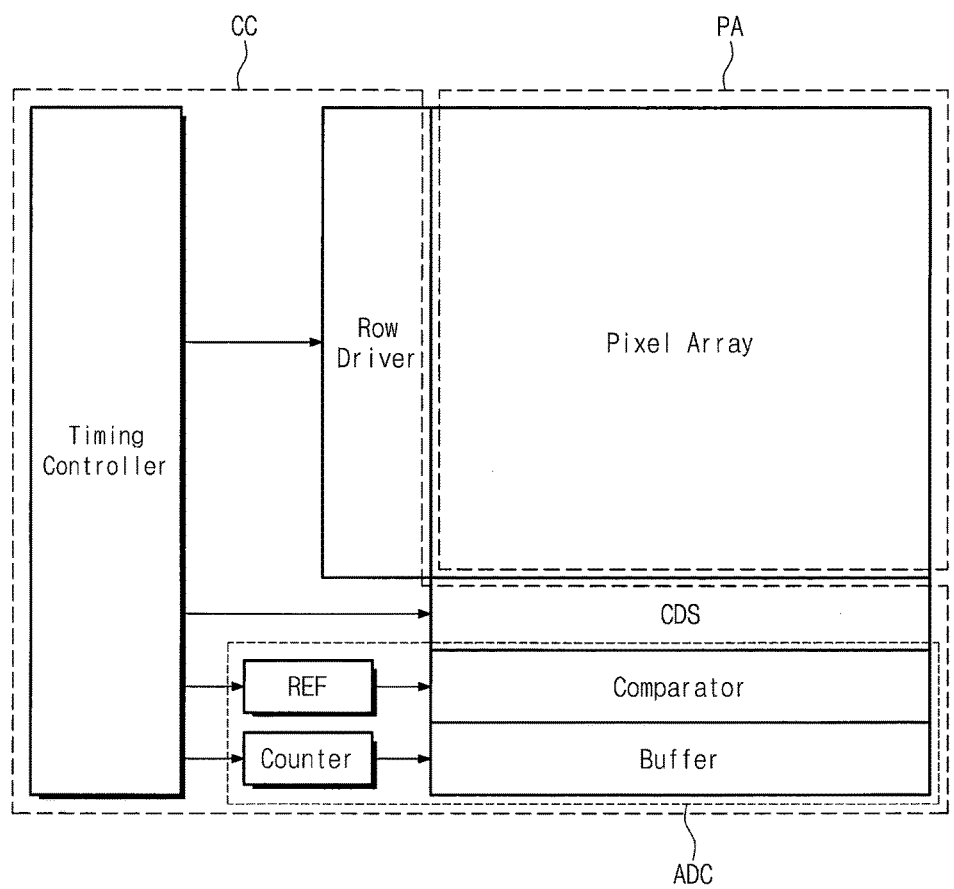
FIG. 11 is a block diagram of an image sensor according to some embodiments of the inventive concept.

FIG. 11 is a block diagram illustrating an image sensor according to some embodiments of the inventive concept. Hereinafter, a complementary metal-oxide semiconductor (CMOS)-type image sensor will be described with reference to FIG. 11.

Referring to FIG. 11, an image sensor may include a pixel array PA and a signal processing unit CC. The pixel array PA may be configured to convert incident light to electric signals. The pixel array PA may include a plurality of unit pixels (not shown) arranged in a matrix shape. The pixel array PA may be driven by various driving signals transmitted from the signal processing unit CC and may provide the converted electrical signals to the signal processing unit CC.

The signal processing unit CC may be configured to produce image data from the electric signals transmitted from the pixel array PA. The signal processing unit CC may include a row driver, a correlated double sampler (CDS), an analog-to-digital converter (ADC), and a timing controller. The row driver may be connected to each row of the pixel array PA and may generate row driving signals for driving rows of the pixel array PA. For example, the row driver may drive the plurality of unit pixels in the pixel array PA by a unit of row.

The CDS may be configured to perform a correlated doubling sampling using a capacitor and a switch and to output analog sampling signal. The correlated doubling sampling may include calculating a difference between a reference voltage representing a reset state of the unit pixels and an output voltage representing a signal component corresponding to incident light. The analog sampling signals may be generated to have correspondence to an effective signal component. The CDS may include a plurality of CDS circuits respectively connected to column lines of the pixel array PA and may be configured to output the analog sampling signal to each column line.

The ADC may convert the analog sampling signal to a digital image signal. The ADC may include a reference signal generator REF, a comparator, a counter, and a buffer. The signal generator REF may generate a ramp signal, which will be provided to the comparator as a reference signal, with a constant slope. The comparator may compare the analog sampling signal generated by the CDS and output through each column line with the ramp signal generated by the REF and generate a comparative signal, whose transition point is determined by the effective signal component, based on the comparison. The counter may perform a counting operation for generating a counting signal and provide the counting signal to the buffer. The buffer may include a plurality of latch circuits respectively connected to the column lines, latch the counting signal output from the counter to each column line, in response to transition of each comparative signal, and output the latched counting signal serving as the image data to the outside. The timing controller may control operation timing of the row driver, the CDS, and the ADC. The timing controller may provide a timing signal and a control signal to the row driver, the CDS, and the ADC.

The analog double sampling of the image sensor has been described with reference to FIG. 11, but in certain embodiments, the image sensor may be configured to perform a digital double sampling (DDS). The DDS may convert analog signals associated with the reset and signal components to digital signals, when the pixel is initialized, and extract an effective signal component from a difference between these digital signals.

Figure 12:
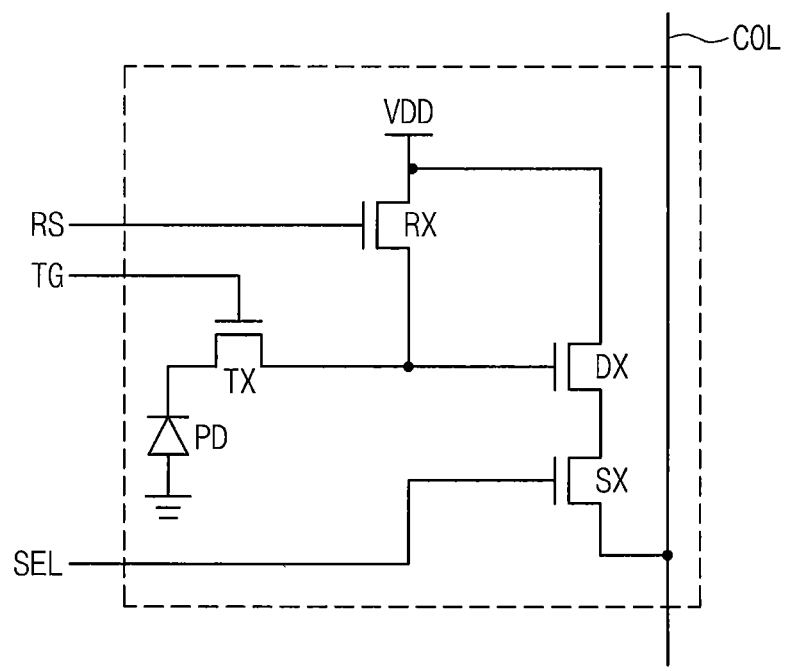
FIG. 12 is a circuit diagram illustrating an example of a unit pixel provided in a pixel array according to some embodiments of the inventive concept.

FIG. 12 is a circuit diagram exemplarily illustrating a unit pixel of a pixel array according to some embodiments of the inventive concept. Referring to FIG. 12, the unit pixel may include a photodiode PD, which is used as a light detection device, and a transfer transistor TX, a reset transistor RX, a drive transistor DX, and a selection transistor SX constituting a readout circuit. The photodiode PD may receive external light (e.g., visible or infrared light) and generate photocharges from the light. In some embodiments, the unit pixel may include at least one of a phototransistor, a photo gate, or a pinned photo diode, along with or instead of the photodiode PD.

The photocharges generated in the photodiode PD may be transferred to a floating diffusion node FD through the transfer transistor TX. For example, if a transfer control signal TG has a first level (e.g., a high level), the transfer transistor TX may be turned-on, and the photocharges generated in the photodiode PD may be transferred to the floating diffusion node FD through the transfer transistor TX.

The drive transistor DX may serve as a source follower buffer amplifier and may generate a signal amplified to have a level corresponding to an amount of the photocharge stored in the floating diffusion node FD. The selection transistor SX may transfer the amplified signal to a column line COL, in response to a selection signal SEL. The floating diffusion node FD may be reset by the reset transistor RX. For example, the reset transistor RX may discharge the photocharges stored in the floating diffusion node FD after every period of the CDS operation, in response a reset signal RS. Although FIG. 12 shows the unit pixel including one photodiode PD and four MOS transistors TX, RX, DX, and SX, but the inventive concept is not limited thereto.

Figure 13:
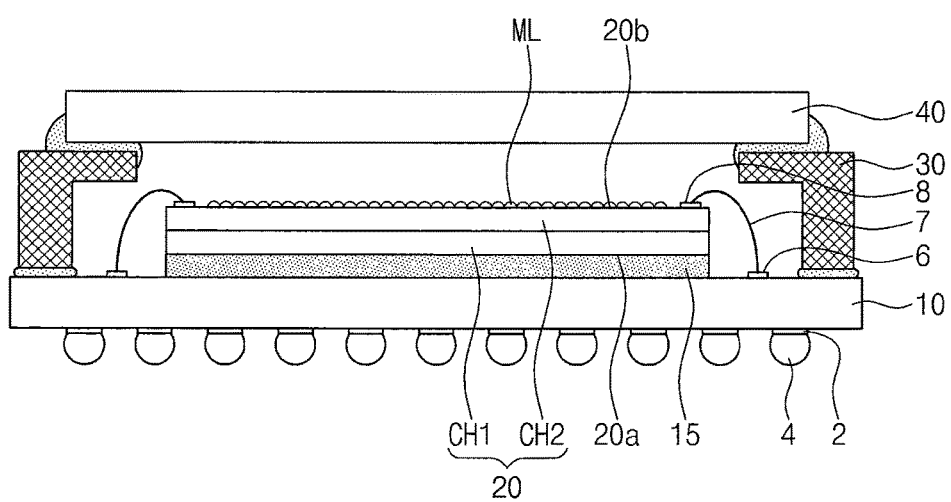
FIG. 13 is a sectional view illustrating a semiconductor package equipped with an image sensor chip according to some embodiments of the inventive concept.
Figure 14:
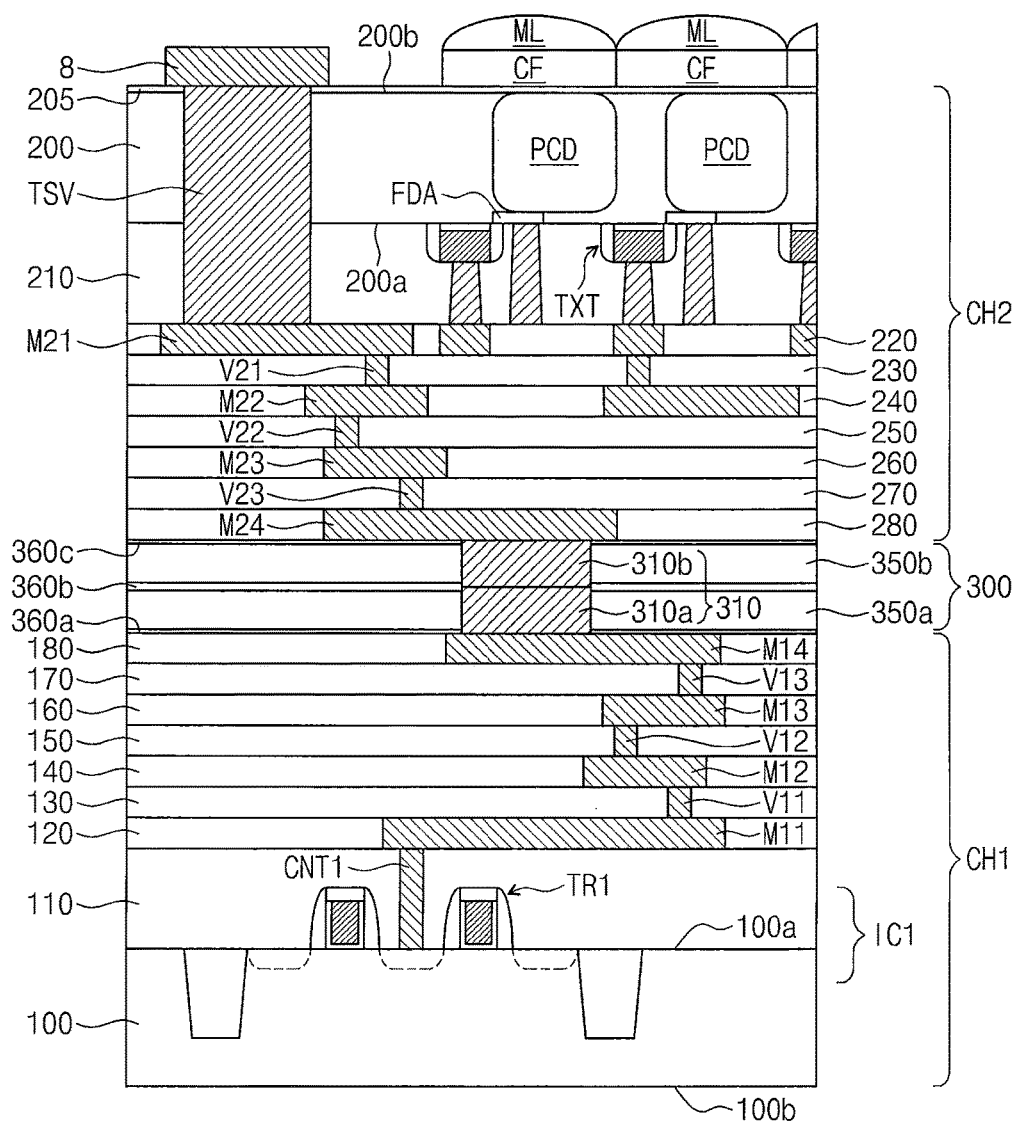
FIG. 14 is an enlarged sectional view illustrating a portion (e.g., corresponding to a region 'M' of FIG. 13) of an image sensor chip according to some embodiments of the inventive concept.

FIG. 13 is a sectional view illustrating a semiconductor package equipped with an image sensor chip according to some embodiments of the inventive concept. FIG. 14 is an enlarged sectional view illustrating a portion (e.g., corresponding to a region 'M' of FIG. 13) of an image sensor chip according to some embodiments of the inventive concept. For concise description, an element previously described with reference to FIGS. 1 and 2 may be identified by a similar or identical reference number and repeated description thereof may be omitted.

Referring to FIGS. 13 and 14, an image sensor chip 20 may be mounted on the package substrate 10. Furthermore, a holder 30 may be provided on the package substrate 10 to have a top surface spaced apart from the image sensor chip 20. A transparent substrate 40 may be disposed adjacent to the top surface of the holder 30.

The image sensor chip 20 may have a first surface 20a facing towards the package substrate 10 and a second surface 20b on an opposite side of the image sensor chip 20. In some embodiments, the image sensor chip 20 may include the first sub chip CH1 and the second sub chip CH2, which are vertically stacked on the package substrate 10. A plurality of micro lenses ML may be disposed on the second surface 20b of the image sensor chip 20.

The first sub chip CH1 may be a logic chip. The first sub chip CH1 may include, for example, the signal processing unit CC described with reference to FIG. 11. The second sub chip CH2 may be a pixel array chip. The second sub chip CH2 may include, for example, the pixel array PA described with reference to FIG. 11.

The second sub chip CH2 may include photoelectric conversion devices PCD, a floating diffusion regions FDA, and read circuit devices, which are integrated on the second substrate 200. The read circuit devices may be transmission transistors TXT. The second substrate 200 may include a semiconductor layer formed by an epitaxial process. For example, the second substrate 200 may be a semiconductor substrate doped with p-type impurities.

Unit pixels may be configured to generate image data, when light is incident therein through the bottom surface 200b of the second substrate 200. In other words, the image sensor chip 20 according to some embodiments of the inventive concept may be a backside illuminated image sensor, which is configured to produce image data from light to be incident thereto through the bottom surface 200b of the second substrate 200.

As an example, in the backside-illuminated type image sensor including the unit pixels, a plurality of transistors may be disposed on the top surface 200a of the second substrate 200 to transmit and amplify electric signals (e.g., photocharges) that are generated from the incident light. Color filters CF and the micro lenses ML may be disposed on the bottom surface 200b of the second substrate 200 to guide the incident light into the photoelectric conversion devices PCD.

The photoelectric conversion devices PCD may be formed in the second substrate 200 to generate photocharges corresponding to the incident light. For example, in each of the photoelectric conversion devices PCD may be configured to allow electron-hole pairs to be produced by the incident light and to collect such electric charges (e.g., electrons or holes). The photoelectric conversion devices PCD may be doped to have a different conductivity type (e.g., n-type) from that of the second substrate 200.

As shown in FIG. 14, photo diodes may be used for the photoelectric conversion devices PCD. However, in certain embodiments, each of the photoelectric conversion devices PCD may include a photo diode, a photo transistor, a photo gate, a pined photo diode, or a combination thereof.

The transmission transistors TXT may be disposed on the top surface 200a of the second substrate 200 to transmit the photocharges generated by the photoelectric conversion devices PCD into the floating diffusion regions FDA of the second substrate 200. The transmission transistors TXT may be configured to receive transmission signals. In the case where the transmission signal is activated, the photocharges may be transmitted to the floating diffusion regions FDA.

The floating diffusion regions FDA may receive the photocharges through the transmission transistors TXT. The image data may be determined, depending on an amount of the photocharges to be transmitted to floating diffusion regions FDA.

The color filters CF may be disposed on the photoelectric conversion devices PCD, respectively. The color filters CF may include an array of color filters that are arranged in a matrix shape. In some embodiments, the color filter array may be configured to form the Bayer pattern including red, green, and blue filters, e.g., the color filters CF may include red filters, green filters, and blue filters. In certain embodiments, the color filter array may include yellow, magenta, and cyan filters, e.g., the color filters CF may include yellow filters, magenta filters, and cyan filters. In some embodiments, the color filter array may be configured to further include white filters.

The micro lenses ML may be disposed on the color filters CF in such a way that each of them faces a corresponding one of the photoelectric conversion devices PCD. Each of the micro lenses ML may be configured to condense incident light onto a corresponding one of the photoelectric conversion devices PCD. In some embodiments, the plurality of micro lenses ML may be disposed in a matrix arrangement.

An anti-reflection layer 205 may be provided between the color filters CF and the bottom surface 200b of the second substrate 200. The anti-reflection layer 205 may be configured to prevent the incident light from being reflected by the bottom surface 200b of the second substrate 200. For example, the anti-reflection layer 205 may be a multi-layered structure including at least two different films that are alternately stacked. The films of the anti-reflection layer 205 may have refractive indices different from each other. The more the films constituting the anti-reflection layer 205, the higher transmittance of the anti-reflection layer 205.

The upper interlayer insulating layers 210-280 may be stacked on the top surface 200a of the second substrate 200. The upper metal layers M21-M24 and the upper via group V21-V23 may be disposed in the upper interlayer insulating layers 210-280. The first to third upper vias V21, V22, and V23 may be provided to connect the upper metal layers M21-M24 to each other in a vertical direction. For example, the upper metal layers M21-M24 may be electrically connected to the read circuit devices (e.g., transmission transistors TXT) through additional interconnections.

The first sub chip CH1 may include a plurality of first transistors TR1, which are formed on a first substrate 100 and constitute additional read circuit devices and the signal processing unit CC. For example, although not illustrated in the drawings, the read circuit devices may include a reset transistor, a drive transistor, and a selection transistor. In certain embodiments, the read circuit devices including the reset, drive, and selection transistors may be formed on the second substrate 200, but the inventive concept is not limited thereto.

The reset transistor may receive a reset signal. For example, the reset transistor may receive a voltage for resetting the floating diffusion regions FD. When the reset signal is activated, electric charges stored in the floating diffusion regions FDA may be discharged, and thus, the floating diffusion regions FDA may be reset.

The first sub chip CH1 and the second sub chip CH2 may be electrically connected to each other through the connection region 310. Furthermore, the through via TSV may be disposed to pass through the second substrate 200. The through via TSV may be horizontally separated from the unit pixels in the second sub chip CH2. The through via TSV may be electrically connected to at least one of the upper metal layers M21-M24.

The bonding pad 8 may be disposed on the bottom surface 200b of the second substrate 200. As an example, the bonding pad 8 may serve as the I/O pad, to which the I/O signal is applied. The bonding pad 8 may be electrically connected to the through via TSV penetrating the bottom surface 200b.

Similar to that described with reference to FIG. 2, when viewed in plan view, at least one of the lower via group V11-V13, the upper via group V21-V23, and the connection region 310 may not overlap the through via TSV.

According to some embodiments of the inventive concept, a semiconductor device may include a semiconductor chip, in which at least two sub chips are stacked. By adjusting arrangements of an input/output terminal, a connection region, and a through via, it is possible to efficiently disperse or reduce stress therefrom. Accordingly, it is possible to prevent the semiconductor device from being deteriorated and moreover to improve reliability of the semiconductor device.

While some embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a first sub chip including a first substrate, first metal layers on the first substrate, and a first via group between the first metal layers, the first via group comprising a plurality of vias electrically interconnecting the first metal layers;
a second sub chip including a second substrate, second metal layers on the second substrate, and a second via group between the second metal layers, the second via group comprising a plurality of vias electrically interconnecting the second metal layers;
a connection layer disposed between the first and second sub chips and including an insulating layer interposed between the first and second sub chips and a connection region disposed in the insulating layer and electrically connecting the first metal layers to the second metal layers; and
a through via passing through the second substrate and electrically connected to the second metal layers,
wherein at least one of the first via group, the second via group, and the connection region is laterally spaced apart from the through via.

2. The device of claim 1, further comprising an input/output (I/O) pad on a first surface of the second substrate, wherein the through via is electrically connected to the input/output pad and wherein the second metal layers are disposed on a second surface of the second substrate on an opposite side of the second substrate from the first surface.

3. The device of claim 1, wherein the connection region is laterally spaced apart from the through via.

4. The device of claim 3, wherein the first via group and the second via group substantially overlap.

5. The device of claim 3, wherein at least one of the first via group or the second via group substantially overlaps the connection region.

6. The device of claim 3, wherein at least one of the first via group or the second via group substantially overlaps the through via.

7. The device of claim 3, wherein the first via group, the second via group, the connection region, and the through via are laterally spaced apart.

8. The device of claim 1, wherein the first and second sub chips form a semiconductor chip having first and second surfaces on opposite sides of the semiconductor chip, and wherein the first and second substrates are disposed adjacent respective ones of the first and second surfaces.

9. The device of claim 1, wherein the connection region comprises a first connection pattern adjacent the first sub chip and a second connection pattern adjacent the second sub chip and in direct contact with the first connection pattern.

10. A semiconductor device, comprising:
a first sub chip including a first substrate and first metal layers on the first substrate;
a second sub chip including a second substrate and second metal layers on the second substrate;

a connection region disposed between the first and second sub chips and electrically connecting the first metal layers to the second metal layers;
a through via penetrating the second substrate and electrically connected to the second metal layers; and
an input/output pad electrically connected to the second metal layers through the through via,
wherein the second substrate comprises a first surface, and a second surface on a side of the second substrate opposite the first surface,
wherein the input/output pad is disposed on the first surface, and
wherein the second metal layers are disposed on the second surface,
wherein the first metal layers, the connection region, and the second metal layers are interposed between the first substrate and the second substrate, and
wherein the connection region is laterally spaced apart from the through via.

11. A device comprising:
a first integrated circuit substrate comprising a plurality of first metal layers interconnected by first vias;
a second integrated circuit substrate on the first integrated circuit substrate and comprising second metal layers interconnected by second vias; and
an insulation layer disposed between the first and second integrated circuit substrates;
a connection region in the insulation layer and electrically connecting a first one of the first metal layers to a first one of the second metal layers;
a bonding pad on the second integrated circuit substrate; and
a through via extending from the bonding pad and into the second integrated circuit substrate to contact a second one of the second metal layers, the through via positioned so as to not overlap at least one of the first vias, the second vias and the connection region.

12. The device of claim 11, wherein the through via does not overlap any of the first and second vias and wherein none of the first vias overlap any of the second vias.

13. The device of claim 12, wherein none of the first vias overlaps the connection region and wherein the connection region does not overlap any of the second vias.

14. The device of claim 11, wherein through via does not overlap any of the first and second vias and wherein at least one of the first vias overlaps at least one of the second vias.

15. The device of claim 14, wherein none of the first vias overlaps the connection region and wherein the connection region does not overlap any of the second vias.

16. The device of claim 14, wherein at least one of the first vias overlaps the connection region and wherein the connection region overlaps at least one of the second vias.

17. The device of claim 11, wherein the through via overlaps at least one of the first vias and wherein none of the first vias overlaps the connection region.

18. The device of claim 17, wherein the through via overlaps the connection region.

* * * * *